(12) United States Patent
Barve et al.

(10) Patent No.: US 12,283,795 B2
(45) Date of Patent: Apr. 22, 2025

(54) OPTIMIZING A LAYOUT OF AN EMITTER ARRAY

(71) Applicant: Lumentum Operations LLC, San Jose, CA (US)

(72) Inventors: Ajit Vijay Barve, San Jose, CA (US); Benjamin Kesler, Sunnyvale, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 317 days.

(21) Appl. No.: 18/061,593

(22) Filed: Dec. 5, 2022

(65) Prior Publication Data
US 2023/0094127 A1  Mar. 30, 2023

Related U.S. Application Data

(63) Continuation of application No. 16/684,097, filed on Nov. 14, 2019, now Pat. No. 11,522,344, and a continuation-in-part of application No. 16/363,753, filed on Mar. 25, 2019, now Pat. No. 10,720,758.

(60) Provisional application No. 62/835,791, filed on Apr. 18, 2019, provisional application No. 62/831,513, filed on Apr. 9, 2019, provisional application No. 62/649,366, filed on Mar. 28, 2018.

(51) Int. Cl.
*H01S 5/42* (2006.01)
*H01S 5/042* (2006.01)
*H01S 5/183* (2006.01)
*H01S 5/20* (2006.01)

(52) U.S. Cl.
CPC .......... *H01S 5/423* (2013.01); *H01S 5/04254* (2019.08); *H01S 5/04256* (2019.08); *H01S 5/18308* (2013.01); *H01S 5/18313* (2013.01); *H01S 5/1833* (2013.01); *H01S 5/2063* (2013.01); *H01S 2301/176* (2013.01)

(58) Field of Classification Search
CPC ............. H01S 5/42–426; H01S 5/0425; H01S 5/04254–04257
See application file for complete search history.

(56) References Cited

U.S. PATENT DOCUMENTS

| | | | |
|---|---|---|---|
| 5,727,014 A | 3/1998 | Wang et al. |
| 5,729,566 A | 3/1998 | Jewell |
| 5,896,408 A | 4/1999 | Corzine et al. |
| 5,978,408 A | 11/1999 | Thornton |
| 6,507,595 B1 | 1/2003 | Kapon et al. |

(Continued)

FOREIGN PATENT DOCUMENTS

| | | |
|---|---|---|
| CN | 1515053 A | 7/2004 |
| CN | 107104363 A | 8/2017 |

(Continued)

*Primary Examiner* — Sean P Hagan
(74) *Attorney, Agent, or Firm* — Harrity & Harrity, LLP

(57) ABSTRACT

A closely spaced emitter array may include a first emitter comprising a first plurality of structures and a second emitter, adjacent to the first emitter, comprising a second plurality of structures. The first emitter and the second emitter may be configured in the closely spaced emitter array such that different types of structures between the first plurality of structures and the second plurality of structures do not overlap while maintaining close spacing between the first emitter and the second emitter.

20 Claims, 8 Drawing Sheets

(56) References Cited

U.S. PATENT DOCUMENTS

| | | |
|---|---|---|
| 7,149,235 B2 | 12/2006 | Tojo et al. |
| 7,817,696 B2 | 10/2010 | Hatakeyama |
| 10,581,225 B1 * | 3/2020 | Su .................. H01S 5/18305 |
| 10,720,758 B2 | 7/2020 | Yuen et al. |
| 11,522,344 B2 | 12/2022 | Barve et al. |
| 2002/0048292 A1 | 4/2002 | Bissinger et al. |
| 2002/0172247 A1 | 11/2002 | Sopra et al. |
| 2005/0019973 A1 | 1/2005 | Chua |
| 2006/0045162 A1 | 3/2006 | Johnson |
| 2006/0227836 A1 | 10/2006 | Omori et al. |
| 2006/0269666 A1 | 11/2006 | Nagawa et al. |
| 2008/0240196 A1 | 10/2008 | Nishida |
| 2013/0022063 A1 | 1/2013 | Kumei |
| 2013/0272330 A1 | 10/2013 | Joseph et al. |
| 2015/0222094 A1 | 8/2015 | Lee et al. |
| 2017/0244219 A1 | 8/2017 | Barve et al. |
| 2017/0353012 A1 | 12/2017 | Barve et al. |
| 2020/0335943 A1 * | 10/2020 | Qiao .................. H01S 5/18322 |
| 2020/0350746 A1 | 11/2020 | Yuen et al. |

FOREIGN PATENT DOCUMENTS

| | | |
|---|---|---|
| JP | 2013065692 A | 4/2013 |
| WO | 2012059850 A1 | 5/2012 |

\* cited by examiner

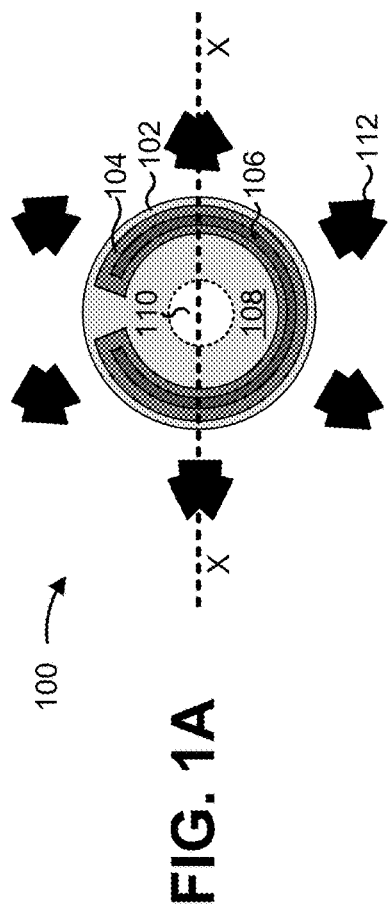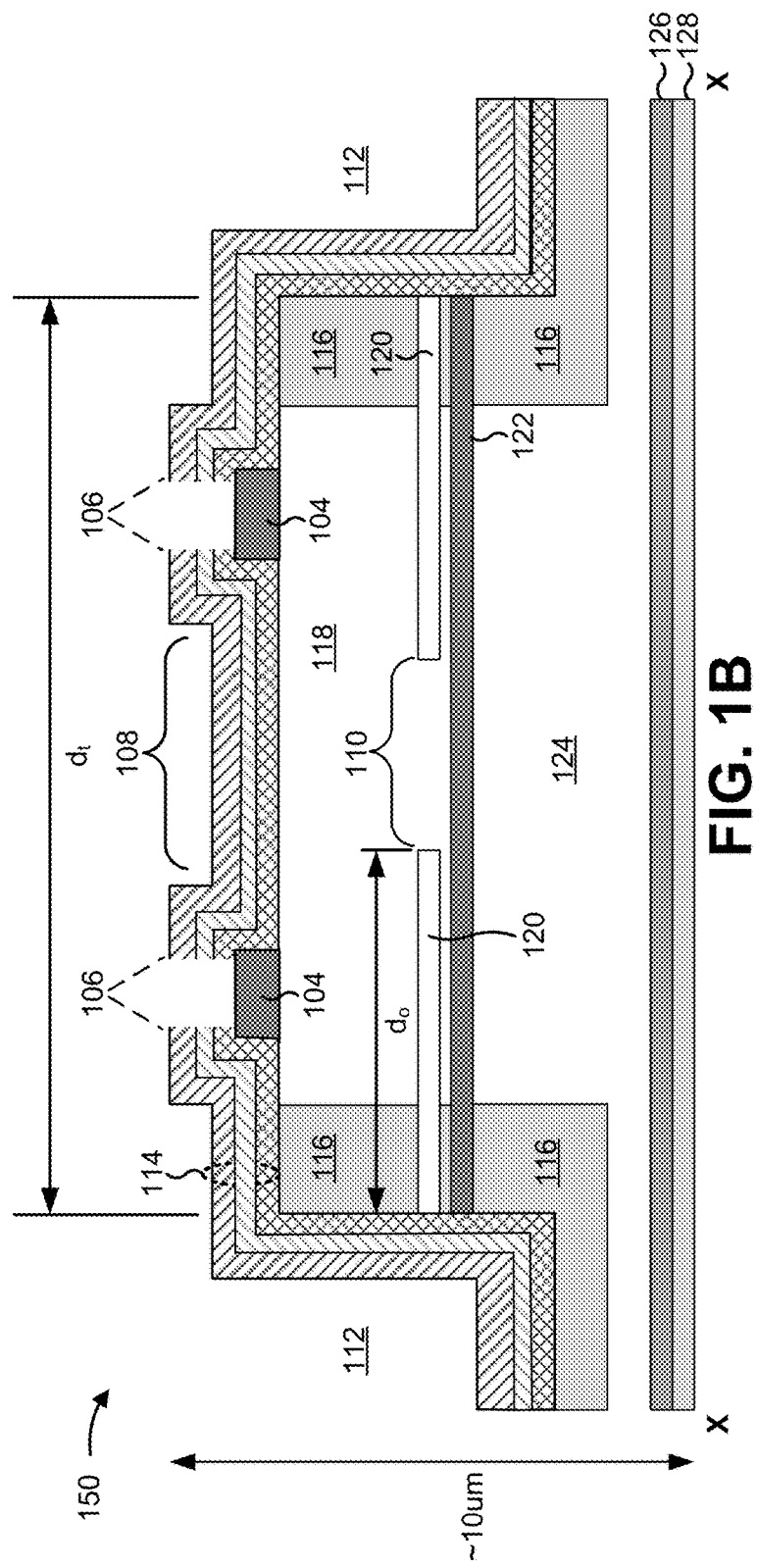
FIG. 1A
FIG. 1B

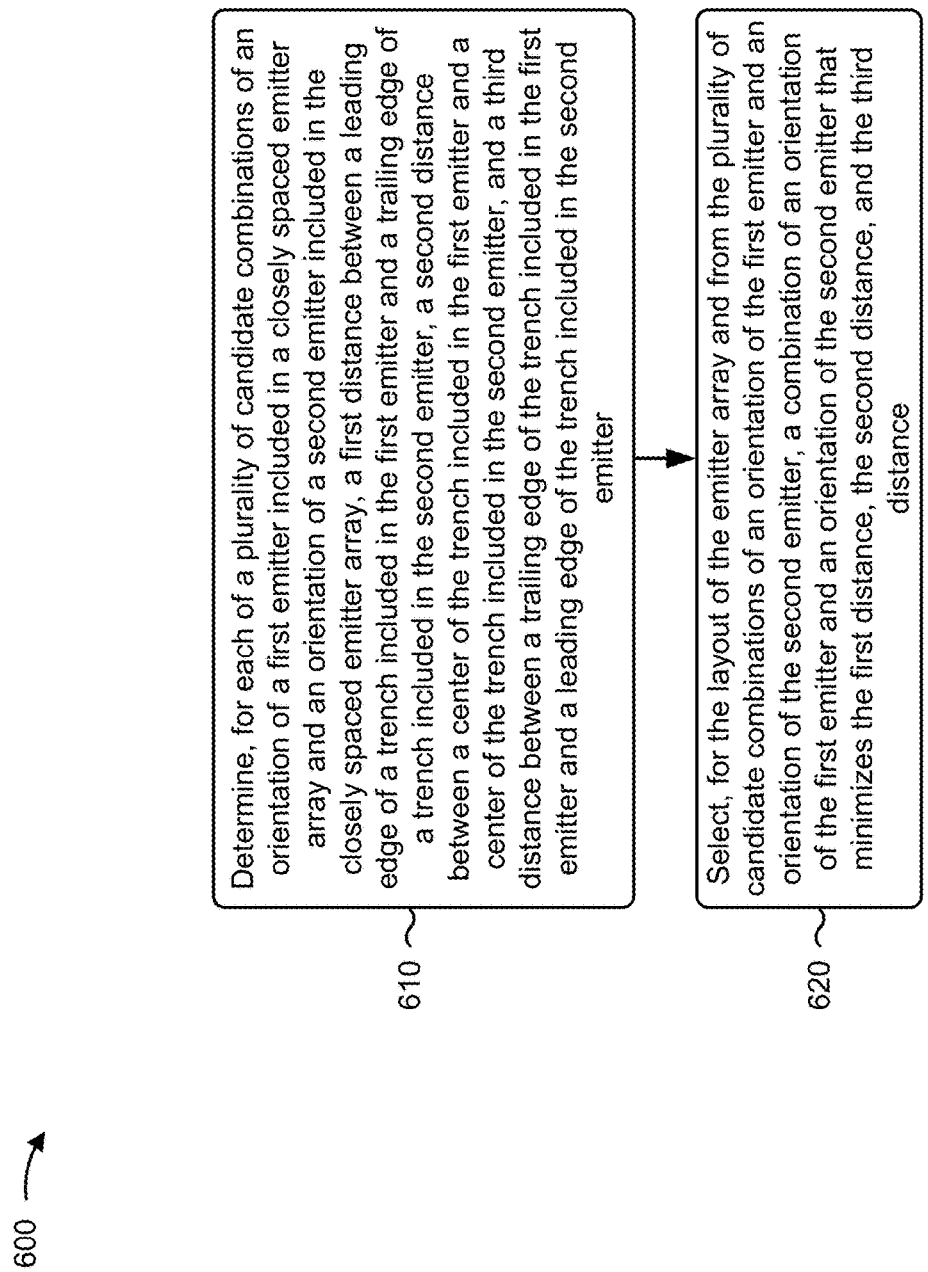

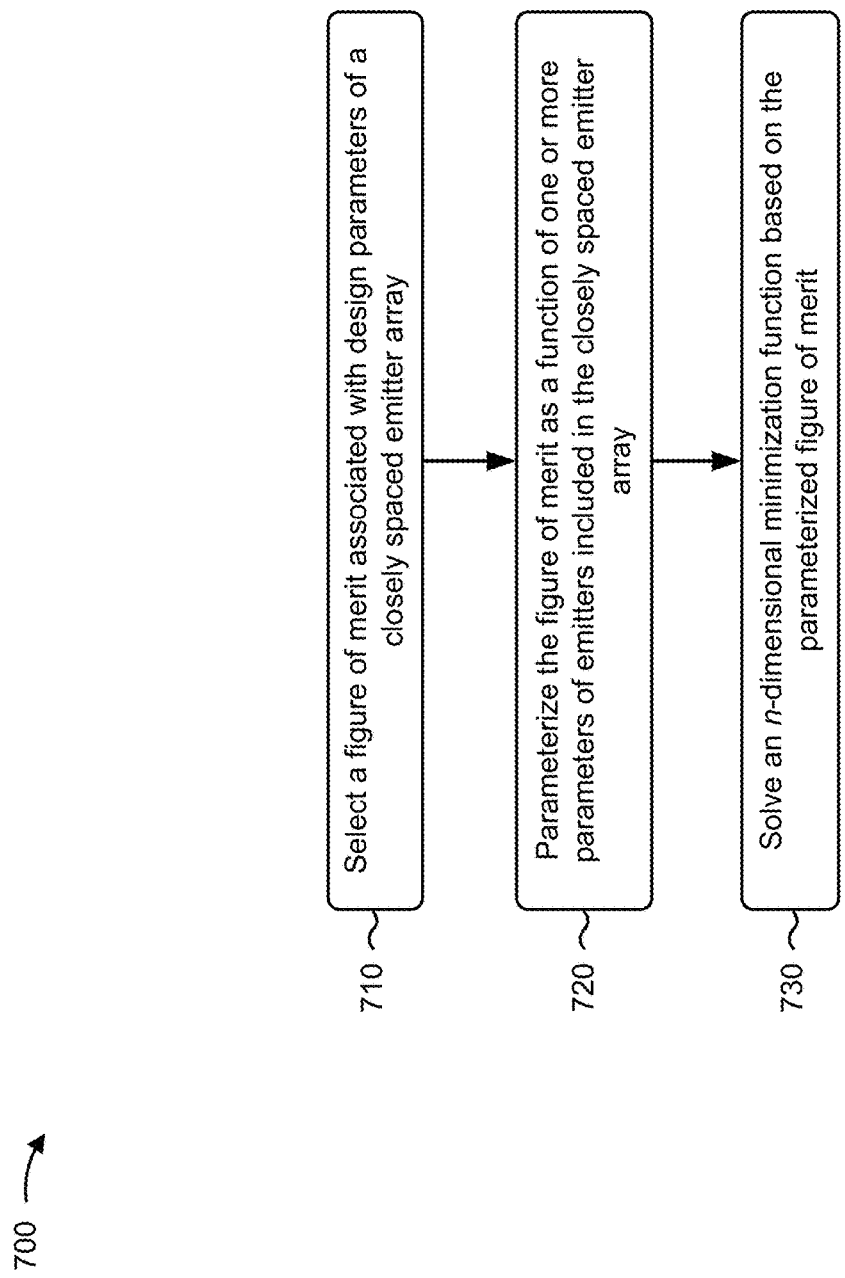

OPTIMIZING A LAYOUT OF AN EMITTER ARRAY

RELATED APPLICATIONS

This application is a continuation of U.S. patent application Ser. No. 16/684,097, filed Nov. 14, 2019 (now U.S. Pat. No. 11,522,344), which claims priority to U.S. Provisional Patent Application No. 62/831,513, filed on Apr. 9, 2019, and entitled "OPTIMIZING EMITTER ORIENTATION TO MAXIMIZE EMITTER DENSITY ORIENTATION," and U.S. Provisional Patent Application No. 62/835,791, filed on Apr. 18, 2019, and entitled "OPTIMIZING EMITTER LAYOUT WITHIN AN ARRAY FOR DENSELY PACKET ARRAY DESIGN," and is a continuation-in-part of U.S. patent application Ser. No. 16/363,753 (now U.S. Pat. No. 10,720,758), filed on Mar. 25, 2019, and entitled "EMITTER ARRAY WITH SHARED VIA TO AN OHMIC METAL SHARED BETWEEN ADJACENT EMITTERS," which claims priority to U.S. Provisional Patent Application No. 62/649,366, filed on Mar. 28, 2018, and entitled "INTERSTITIAL VIA FOR HIGH DENSITY VERTICAL CAVITY SURFACE EMITTING LASER (VCSEL) ARRAY," the contents of which are incorporated by reference herein in their entireties.

TECHNICAL FIELD

The present disclosure relates to emitter arrays and, more particularly, to optimizing a layout of an emitter array.

BACKGROUND

An emitter can include a vertical-emitting device, such as a vertical cavity surface emitting laser (VCSEL). A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

According to some implementations, a closely spaced emitter array may comprise a first emitter comprising a first plurality of structures; and a second emitter, adjacent to the first emitter, comprising a second plurality of structures, wherein the first emitter and the second emitter are configured in the closely spaced emitter array such that different types of structures between the first plurality of structures and the second plurality of structures do not overlap while maintaining close spacing between the first emitter and the second emitter.

According to some implementations, a method may comprise generating, by a device, a layout of a closely spaced emitter array that includes a plurality of emitters; identifying, by the device, an overlap of different types of structures between a first plurality of structures included in a first emitter of the plurality of emitters and a second plurality of structures included in a second emitter of the plurality of emitters; and adjusting, by the device, the layout of the closely spaced emitter array such that different types of structures between the first plurality of structures and the second plurality of structures do not overlap while maintaining close spacing between the plurality of emitters.

According to some implementations, a closely spaced emitter array may comprise a first plurality of emitters, each comprising a respective first plurality of structures, wherein the first plurality of emitters is configured in the closely spaced emitter array such that different types of structures between each of the first plurality of emitters do not overlap while maintaining close spacing between the first plurality of emitters; and a second plurality of emitters, each comprising a respective second plurality of structures, wherein the second plurality of emitters is configured in the closely spaced emitter array such that different types of structures between each of the second plurality of emitters do not overlap while maintaining close spacing between the second plurality of emitters.

BRIEF DESCRIPTION OF THE DRAWINGS

FIGS. 1A and 1B are diagrams depicting a top-view of an example vertical-emitting device and a cross-sectional view of the example vertical-emitting device, respectively.

FIGS. 4-7 are flow charts of example processes for optimizing a layout of a closely spaced emitter array.

DETAILED DESCRIPTION

Figure 2A:
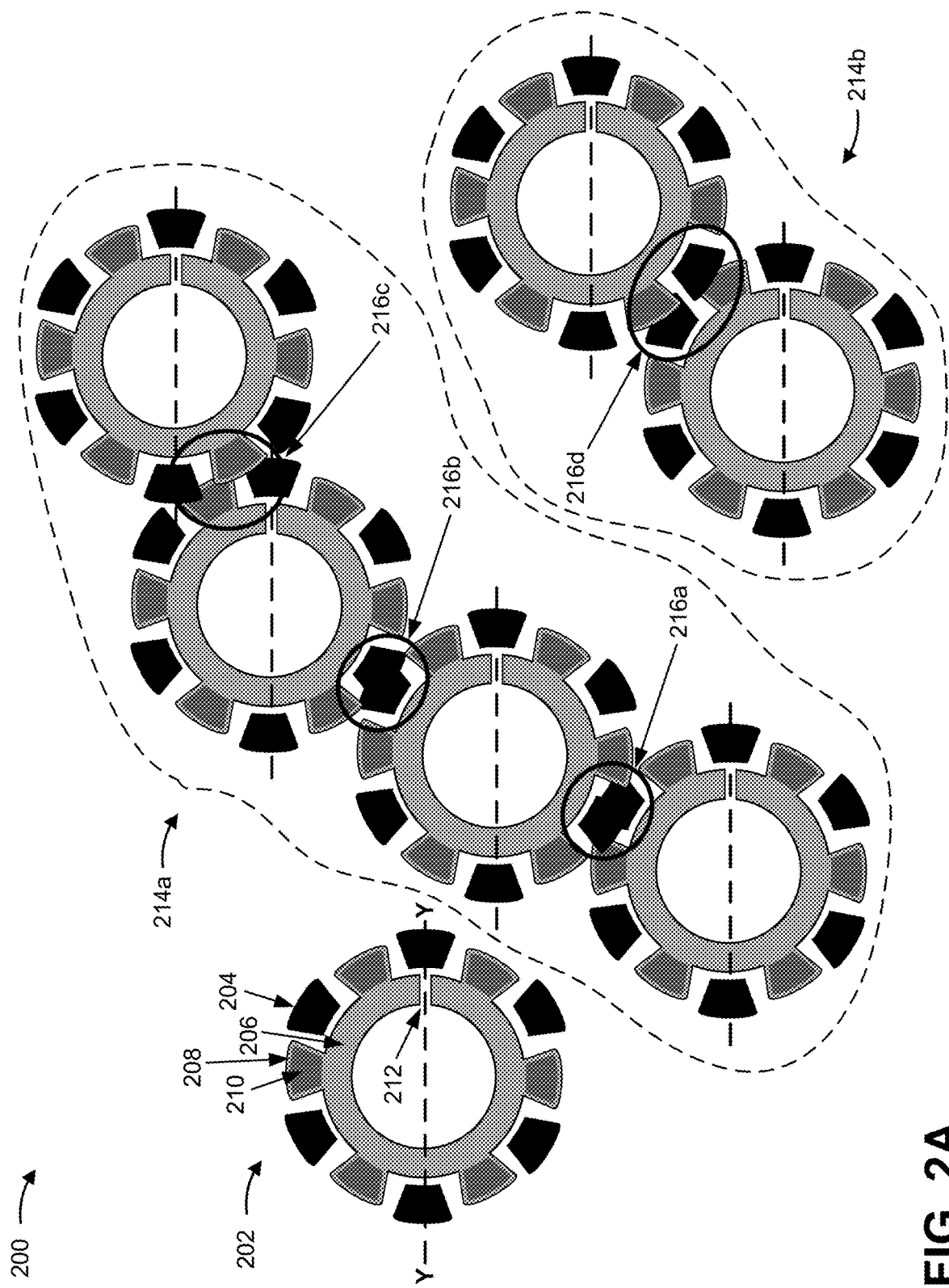
FIGS. 2A and 2B are diagrams of one or more example implementations described herein.

The following detailed description of example implementations refers to the accompanying drawings. The same reference numbers in different drawings may identify the same or similar elements.

Emitter arrays are used in various applications. For example, emitter arrays are used in three-dimensional sensing applications, such as structured light applications, time-of-flight applications, light detection and ranging (LIDAR) applications, and/or the like. An emitter array includes multiple emitters, such as multiple vertical light-emitting devices formed on a chip, which is in turn formed on a wafer. Typically, an emitter includes a mesa structure that includes an ohmic metal layer around an aperture of the emitter (e.g., in a ring or partial ring shape) and a set of vias through protective layers down to the ohmic metal layer (e.g., in a ring or partial ring shape that matches the shape of the ohmic metal layer). In addition, the emitter array includes trenches between the mesa structure of the emitter (and in some cases that form the mesa structure) and one or more other emitters of the emitter array. For example, the trenches are often formed around the ohmic metal layer and/or the corresponding set of vias of the emitter. This configuration of an emitter and/or an emitter array (e.g., where a trench is formed around the ohmic metal layer and the corresponding set of vias) often results in narrow manufacturing tolerances, overlapping of different emitter structures (e.g., overlapping of a via of an emitter with a trench of another via, overlapping of a trench or via with an ohmic metal layer extension, and/or the like), and/or often requires a particular amount of chip space for each emitter of an emitter array. The more closely that the emitters of an emitter array can be spaced, the more the overall chip size can be reduced. Small chip sizes allow more chips per wafer, and smaller chips can be placed in smaller packages, thereby reducing the overall cost of the chip and package.

Some implementations described herein provide various techniques and apparatuses for optimizing a layout of an emitter array. In some implementations, techniques, processes, and/or algorithms described herein may configure, adjust, and/or modify parameters of emitters included in an emitter array and/or parameters of the structures (e.g., vias, trenches, p-metal extensions, and/or the like) to optimize an existing layout of the emitter array, to generate a new and optimized layout for an emitter array, and/or the like. For example, the techniques, processes, and/or algorithms described herein may align like structures of two or more adjacent emitters by rotating one or more of the adjacent emitters such that non-like structures between the two or more adjacent emitters do not overlap. As another example, the techniques, processes, and/or algorithms described herein may adjust and/or modify the size, shape, orientation, and/or other parameters of a structure included in an emitter such that the structure does not overlap with structures of a different type included in one or more adjacent emitters. As another example, the techniques, processes, and/or algorithms described herein may remove a structure from an emitter such that structures of a different type of an adjacent emitter are not overlapped by the structure. As another example, the techniques, processes, and/or algorithms described herein may connect like structures between adjacent emitters such that the adjacent emitters share the same structure, which reduces manufacturing complexity by eliminating tight manufacturing tolerances between the structures if the structures were spaced closely together without being connected.

In this way, the techniques, processes, and/or algorithms described herein conserve space associated with an emitter array and increase density of emitters per chip. In addition, the techniques, processes, and/or algorithms described herein facilitate a reduction in a distance between emitters of an emitter array (e.g., an emitter array with smaller pitch between emitters), facilitate a reduction in an overall chip size associated with the emitter array (e.g., smaller square area for the same number of emitters as prior designs), facilitate an increase in a quantity of emitters that can be included on a chip of a particular size (with particular dimensions compared to prior designs), and/or the like. For example, without layout optimization as described herein, the minimum distance between emitters may be limited to approximately 25 to 30 micrometers (μm) for oxide apertures of 10 μm. With layout optimization based on the techniques, processes, and/or algorithms described herein, the minimum distance between emitters can be reduced (e.g., to approximately 14-24 μm) for a random emitter array. The exact space savings depends on device geometry (e.g., oxide and non-oxide emitters may have different tradeoffs that impact a resulting minimum distance between emitters).

In some applications, such as a three-dimensional sensing application, increasing a quantity of emitters in an emitter array on a chip of a particular size may improve operation of a device that uses the emitter array, by providing the device with a higher quantity of points of light to use for three-dimensional sensing and/or by providing greater power or brightness from a chip of that particular size. Further, reducing a size of emitters on a chip, without increasing a quantity of emitters on the chip, provides wider manufacturing tolerances relative to previous designs of emitter arrays, thereby facilitating faster manufacturing of an emitter array, reduced costs of manufacturing an emitter array, a reduction in defects during manufacturing of an emitter array, a reduction in post-manufacturing defects from propagation of dislocations (e.g., the smaller emitter size, while maintaining a chip size, results in more distance between emitters, which may reduce a likelihood of a dislocation intersecting an emitter), and/or the like.

FIGS. 1A and 1B are diagrams depicting a top-view of an example emitter 100 and a cross-sectional view 150 of an example emitter 100 along the line XX, respectively. As shown in FIG. 1B, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a p-ohmic metal layer or an n-ohmic metal layer) that is constructed in a partial ring-shape (e.g., with an inner radius and an outer radius). The medium gray area shows an area of ohmic metal layer 104 covered by a protective layer (e.g. a dielectric layer, a passivation layer, and/or the like) of emitter 100, and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by a protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are contemplated, such as a compact emitter that includes five trenches 112, seven trenches 112, and/or the like. In some implementations, trench 112 may encircle emitter 100 to form a mesa structure $d_r$. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are contemplated. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "XX" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 μm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or the like.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B are provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100, and any layer may comprise more than one layer.

Figure 2B:
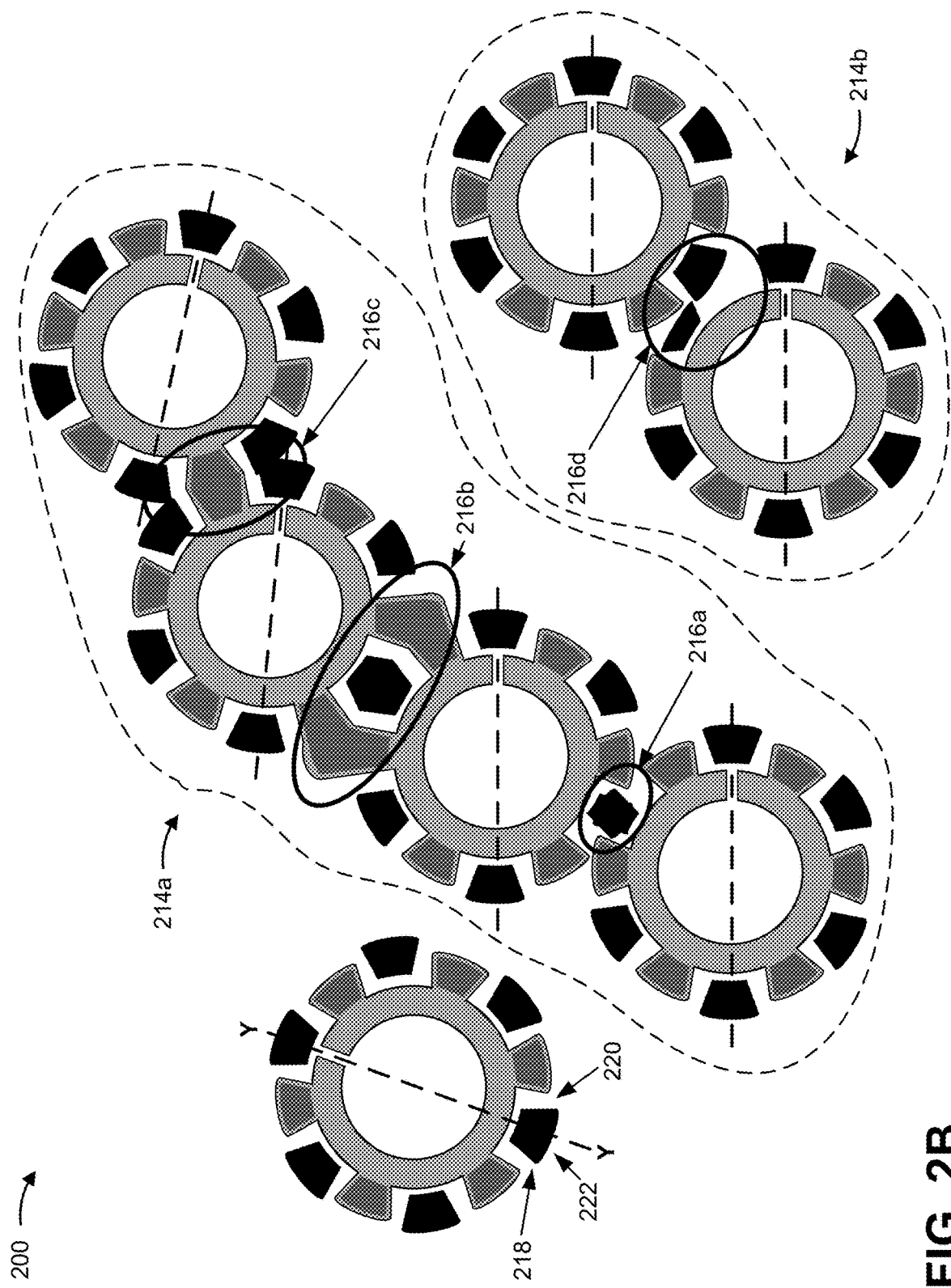

FIGS. 2A and 2B are diagrams of one or more example implementations of optimizing a layout of emitter array 200, as described herein. In some implementations, FIGS. 2A and 2B may illustrate the full emitter array 200. In some implementations, FIGS. 2A and 2B may illustrate a portion of emitter array 200, and the techniques, processes, and/or algorithms described in connection with FIGS. 2A and 2B may be used to optimize the layout of the remaining portions of emitter array 200.

FIG. 2A illustrates a non-optimized layout of emitter array 200. As shown in FIG. 2A, emitter array 200 may include a plurality of emitters 202. In some implementations, a device may generate the non-optimized layout of emitter array 200 to include a two-dimensional pattern (e.g., a grid pattern, a hexagonal pattern, a random pattern, an irregular pattern, and/or the like) or configuration of the plurality of emitters 202 on a substrate of a chip or device.

An emitter 202 may be a vertical light-emitting device, such as a light-emitting diode (LED), a vertical-cavity surface-emitting laser (VCSEL), a vertical external-cavity surface-emitting laser (VECSEL), and/or the like. As further shown in FIG. 2A, an emitter 202 may include a plurality of types of structures, such as one or more trenches 204, one or more p-metal extensions 208 (e.g., that extend radially outward from a p-metal ring 206), one or more vias in the one or more p-metal extensions 208, and/or the like.

In some implementations, trenches 204 may include various oxidation trenches and/or the like. In some implementations, p-metal ring 206 and p-metal extensions 208 may be one or more layers of a p-ohmic metal. In some implementations, one or more protective layers (e.g., dielectric layers, passivation layers, and/or other types of protective layers), included on p-metal ring 206 and p-metal extensions 208, may be removed (e.g., via etching or another process) such that vias 210 are formed through the protective layer to expose a p-ohmic metal under the protective layer. Trenches 204, p-metal extensions 208, and vias 210 may be located about the circumference of p-metal ring 206. Trenches 204 may be interspersed between p-metal extensions 208/vias 210. For example, and as shown in FIG. 2A, trenches 204 and p-metal extensions 208/vias 210 may alternate about the circumference of p-metal ring 206.

As further shown in FIG. 2A, the layout of emitter array 200 may include individual emitters 202 (e.g., non-grouped emitters 202) and one or more groups 214 of emitters 202, such as group 214a, group 214b, and/or the like. A plurality of emitters 202 may be "grouped" if the emitters 202 at least partially overlap (e.g., one or more structures of an emitter 202 at least partially overlap with one or more structures of another emitter 202), if the emitters 202 are within a threshold distance of each other, and/or the like. That is, a group 214 of emitters 202 may include a plurality of contiguous overlapping emitters 202.

Emitters 202 may be configured in emitter array 200 in FIG. 2A such that the orientation of all the emitters 202 are the same orientation. As used herein, the "orientation" of an emitter 202 may refer to a location of a notch 212 in the p-metal ring 206 of the emitter 202, and may be indicated by a line YY through the radius of the p-metal ring 206 and through the notch 212. The combination of the orientation of emitters 202, the tight spacing between emitters 202, the shape, size, and/or other parameters of the structures included in emitters 202 may result in the non-optimized layout of emitter array 200.

In some cases, the layout of emitter array 200 illustrated in FIG. 2A may be a non-optimized layout in that one or more overlaps in regions 216 (e.g., region 216a-216d) of non-like structures of two or more emitters 202 are present in emitter array 200. For example, in regions 216, a trench 204 of a first emitter 202 may at least partially overlap with a p-metal extension 208 and a via 210 of a second emitter 202, and a trench 204 of second emitter 202 may at least partially overlap with a p-metal extension 208 and a via 210 of a first emitter 202. As a result, in some cases, only a minimum spacing between emitters 202 in emitter array 200 of 25 to 30 μm may be achieved.

FIG. 2B illustrates an example optimized layout of emitter array 200. In some implementations, a device may adjust the layout of emitter array 200 to optimize the layout and/or layouts of other emitter arrays using one or more of the techniques, processes, and/or algorithms described herein. The layout of emitter array 200 illustrated in FIG. 2B may be optimized in that different types of structures between emitters 202 in emitter array 200 do not overlap (e.g., between a trench 204 of an emitter 202 and p-metal extension 208 or a via 210 of an adjacent emitter 202), which permits closer spacing between emitters 202 in emitter array 200 relative to a non-optimized layout. In this case, emitter array 200 may be referred to as a closely spaced emitter array in that emitters 202 are permitted to be spaced 14-24 μm apart.

In some implementations, optimizing the layout of emitter array 200 may include modifying or adjusting the orientation of an emitter 202 by rotating emitter 202 such that notch 212 is orientated in a different direction (e.g., by rotating the emitter 202 such that notch 212 is rotated 30 degrees relative to an initial position of notch 212). Rotating one or more adjacent emitters 202 may permit trenches 204 of adjacent emitters 202 to align and/or overlap, may permit p-metal extensions 208 and/or vias 210 of adjacent emitters 202 to align and/or overlap, and may prevent trenches 204 from overlapping with p-metal extensions 208 and/or vias 210 of adjacent emitters 202.

In some implementations, optimizing the layout of emitter array 200 may include modifying or adjusting the spacing between different types of structures between adjacent emitters 202 in emitter array 200. For example, the spacing between a trench 204 in an emitter 202 and a p-metal extension 208 and/or a via 210 in an adjacent emitter 202 may be adjusted such that the trench 204 does not overlap with the p-metal extension 208 and/or the via 210. In some implementations, optimizing the layout of emitter array 200 may include modifying or adjusting the spacing between different types of structures within the same emitter 202. For example, the spacing between a trench 204 in an emitter 202 and a p-metal extension 208 and/or a via 210 in the emitter 202 may be adjusted such that the trench 204 does not overlap with p-metal extensions 208 and/or the vias 210 in adjacent emitter 202.

In some implementations, optimizing the layout of emitter array 200 may include modifying or adjusting the size and/or shape of one or more structures of one or more adjacent emitters 202. In some implementations, modifying the shape of a structure included in an emitter 202 may include changing the shape of the structure to another shape such that the structure does not overlap with a structure of a different type in an adjacent emitter 202. For example, a shape of a trench 204 of an emitter 202 may be changed from being a section of a ring to a triangular shape depending on the geometry of emitter 202 and/or adjacent emitters 202.

In some implementations, modifying the size of a structure included in an emitter 202 may include increasing or decreasing a radial width or sweep angle of the structure. The radial width or sweep angle of a structure may refer to a radial distance between a leading edge 218 (e.g., the first edge of the structure along the circumference of p-metal ring 206 in a counterclockwise direction) and a trailing edge 220 (e.g., the second edge of the structure along the circumference of p-metal ring 206 in a counterclockwise direction) of the structure. The radial width or sweep angle of the structure may be modified or adjusted by increasing or decreasing the distance between leading edge 218 and trailing edge 220, by modifying or adjusting the location of leading edge 218 and/or trailing edge 220, and/or the like.

In some implementations, modifying the size of a structure included in an emitter 202 may include increasing or decreasing a radial width of the structure. The radial width of a structure may refer to a radial distance between p-metal ring 206 and an outer edge 222 of the structure. The radial width of the structure may be modified or adjusted by increasing or decreasing the radial distance between p-metal ring 206 and an outer edge 222.

In some implementations, optimizing the layout of emitter array 200 may include adding or removing one or more structures from an emitter 202 such that the one or more removed structures do not overlap with one or more structures in an adjacent emitter 202. In this case, the emitter 202 may include a different quantity of a particular structure type (or structure types) relative to the adjacent emitter 202. For example, a p-metal extension 208 and/or a via 210 may be removed from an emitter 202 such that the p-metal extension 208 and/or the via 210, and a trench 204 of an adjacent emitter 202, do not overlap.

In some implementations, optimizing the layout of emitter array 200 may include adjusting or modifying an orientation of an emitter 202, adjusting or modifying the size and/or shape of a structure of the emitter 202, and/or the like such that the structure of the emitter 202 may overlap a structure of the same type of an adjacent emitter 202. The overlap of structures of the same type may be an intentional overlap as opposed to unintentional or inadvertent overlap. An unintentional overlap may be an overlap of structures of the same type as a result of a change, such as a rotation of an emitter 202 and/or another type of change, that provides a layout optimization by eliminating overlaps between structures of different types without the intention of causing the structures of the same type to overlap.

An intentional overlap may be an overlapping of structures of the same type such that the overlapping structures may be connected to form a single structure that is shared between the emitter 202 and the adjacent emitter 202. In this case, an emitter 202 may be explicitly rotated for the purpose of causing the overlap of the structures of the same type. As an example, a p-metal extension 208 and an associated via 210 of an emitter 202 may be respectively connected to a p-metal extension 208 and an associated via 210 of an adjacent emitter 202 such that a single p-metal extension 208 and a single via 210 is shared between the emitter 202 and the adjacent emitter 202. This improves a process margin for fabrication of the emitter 202 and adjacent emitter 202, permits electrical current to flow through the single via 210 to the single p-metal extension 208 such that the electrical current may flow through both the emitter 202 and the adjacent emitter 202, and/or the like.

In some implementations, the device may use any of the techniques described above, or a combination thereof, to optimize the layout of emitter array 200 (e.g., to increase the density of emitters 202 in emitter array 200, to reduce and/or minimize overlapping structures of different types, and/or the like). As an example, and as shown in region 216a in FIG. 2B, the sizes of trenches 204 in adjacent emitters 202 may be adjusted or modified (e.g., the radial width or sweep angle of the trenches 204 may be reduced) such that the trenches 204 do not overlap with p-metal extensions 208 and vias 210 of adjacent emitters 202 as shown in the non-optimized configuration of 216a in FIG. 2A.

As another example, and as shown in region 216b in FIG. 2B, the orientation of an emitter 202 may be modified or adjusted (e.g., the emitter 202 may be rotated) such that a trench 204 of the emitter 202 overlaps (e.g., unintentionally or intentionally) with a trench 204 of an adjacent emitter 202. In this example, the rotation of the emitter 202 prevents the trench 204 of emitter 202 from overlapping with p-metal extensions 208 and vias 210 of adjacent emitter 202, and prevents the trench 204 of adjacent emitter 202 from overlapping with p-metal extensions 208 and vias 210 of emitter 202, as shown in the non-optimized configuration of 216b in FIG. 2A. Moreover, the rotation of the emitter 202 permits a p-metal extension 208 and associated via 210 to overlap and connect with a p-metal extensions 208 and associated via 210 of the adjacent via 210, such that a single p-metal extension 208 and associated via 210 is formed and shared between the emitter 202 and the adjacent emitter 202. The rotation of the emitter 202 further permits a trench 204 to overlap and connect with a trench 204 of the adjacent via 210, such that a single trench 204 is formed and shared between the emitter 202 and the adjacent emitter 202.

As another example, and as shown in region 216c in FIG. 2B, the orientation of an emitter 202 and an adjacent emitter 202 may be modified or adjusted (e.g., the emitter 202 and the adjacent emitter 202 may each be rotated) such that each of a plurality of trenches 204 of the emitter 202 overlaps (e.g., unintentionally or intentionally) with a respective trench 204 of the adjacent emitter 202. Moreover, the rotation of the emitter 202 and the adjacent emitter 202 permits a p-metal extension 208 and associated via 210 to intentionally overlap and connect with a p-metal extension 208 and associated via 210 of the adjacent via 210, such that a single p-metal extension 208 and associated via 210 is formed and shared between the emitter 202 and the adjacent emitter 202.

In some implementations, various combinations of structures may be connected between an emitter 202 and an adjacent emitter 202, such as one or more p-metal extensions 208 and associated vias 210 between the emitter 202 and the adjacent emitter 202 (e.g., a plurality as shown in region 216b of FIG. 2B, a single p-metal extension 208 and associated via 210, and/or the like), one or more trenches 204 between the emitter 202 and the adjacent emitter 202 (e.g., as shown in region 216b and 216c in FIG. 2B), p-metal extensions 208 may be connected between the emitter 202 and the adjacent emitter 202 but not associated vias 210, p-metal extensions 208 and/or associated vias 210 may be connected between the emitter 202 and the adjacent emitter 202 but not trenches 204, trenches 204 may be connected between the emitter 202 and the adjacent emitter 202 but not p-metal extensions 208 and/or associated vias 210, and/or other combinations.

As another example, and as shown in region 216d in FIG. 2B, the size of a first trench 204 in an emitter 202 may be adjusted or modified (e.g., the radial width of the trenches 204 may be reduced) such that the first trench 204 does not overlap with a p-metal extension 208 and an associated via 210 of an adjacent emitter 202, as shown in the non-optimized configuration of 216d in FIG. 2A. Moreover, a second trench 204 of the emitter 202 may be removed such that the second trench 204 does not overlap with a p-metal extension 208 and an associated via 210 of the adjacent emitter 202.

In some implementations, the device may use any of the techniques described above and/or other techniques, or a combination thereof, in a process (e.g., either iterative or non-iterative), an algorithm (e.g., either iterative or noniterative), and/or the like to optimize the layout of emitter array 200 (e.g., to increase the density of emitters 202 in emitter array 200, to reduce and/or minimize overlapping structures of different types, and/or the like). For example, the device may use any of the techniques described above and/or other techniques, or a combination thereof, in process 400 of FIG. 4, process 500 of FIG. 5, process 600 of FIG. 6, process 700 of FIG. 7, and/or the like to optimize the layout of emitter array 200.

In this way, the techniques, processes, and/or algorithms described herein may be used to optimize the layout of emitter array 200 and/or other emitter arrays to conserve space associated with an emitter array and increase density of emitters per chip. In addition, the techniques, processes, and/or algorithms described herein facilitate a reduction in a distance between emitters of an emitter array (e.g., an emitter array with smaller pitch between emitters), facilitate a reduction in an overall chip size associated with the emitter array (e.g., a smaller area for the same number of emitters as prior designs), facilitate an increase in a quantity of emitters that can be included on a chip of a particular size (with particular dimensions compared to prior designs), and/or the like.

As indicated above, FIGS. 2A and 2B are provided as one or more examples. Other examples may differ from what is described with regard to FIGS. 2A and 2B.

Figure 3:
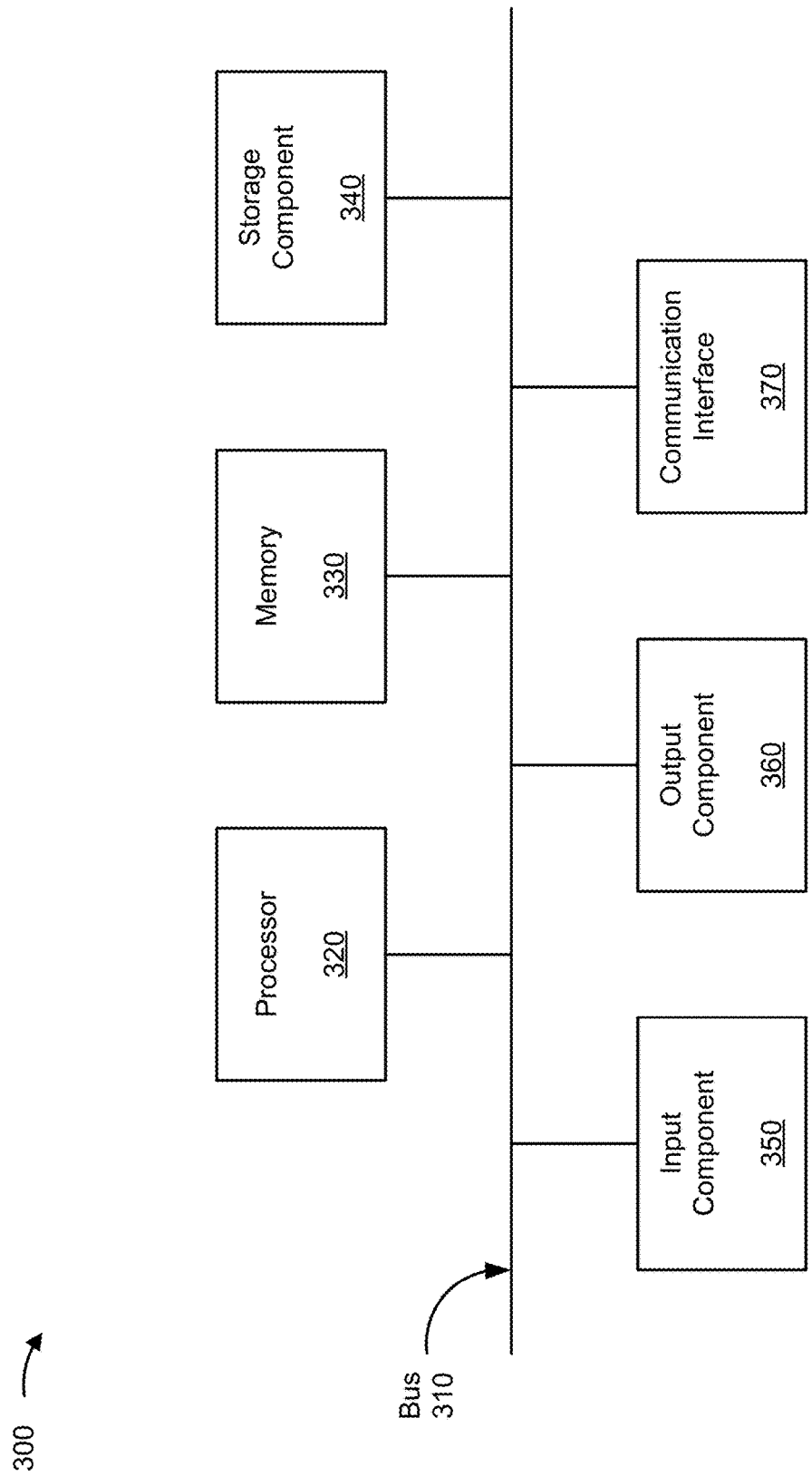
FIG. 3 is a diagram of example components of a device.

FIG. 3 is a diagram of example components of a device 300. Device 300 may include a computing device, such as a laptop computer, a tablet computer, a handheld computer, a desktop computer, a server computer, a workstation computer, a virtual machine provided in a cloud computing environment, one or more devices in a distributed computing network, and/or the like. In some implementations, the laptop computer, the tablet computer, the handheld computer, the desktop computer, the server computer, the workstation computer, the virtual machine provided in the cloud computing environment, the one or more devices in the distributed computing network, and/or the like may include one or more devices 300 and/or one or more components of device 300. As shown in FIG. 3, device 300 can include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 takes the form of a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 can include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 can include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 can permit device 300 to receive information from another device and/or provide information to another device. For example, communication interface 370 can include an Ethernet interface, an optical interface, a coaxial interface, an infrared interface, a radio frequency (RF) interface, a universal serial bus (USB) interface, a Wi-Fi interface, a cellular network interface, or the like.

Device 300 can perform one or more processes described herein. Device 300 can perform these processes based on to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions can be read into memory 330 and/or storage component 340 from another computer-readable medium or from another device via communication interface 370. When executed, software instructions stored in memory 330 and/or storage component 340 can cause processor 320 to perform one or more processes described herein. Additionally, or alternatively, hardwired circuitry can be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 can include additional components, fewer components, different components, or differently arranged components than those shown in FIG. 3. Additionally, or alternatively, a set of components (e.g., one or more components) of device 300 can perform one or more functions described as being performed by another set of components of device 300.

Figure 4:
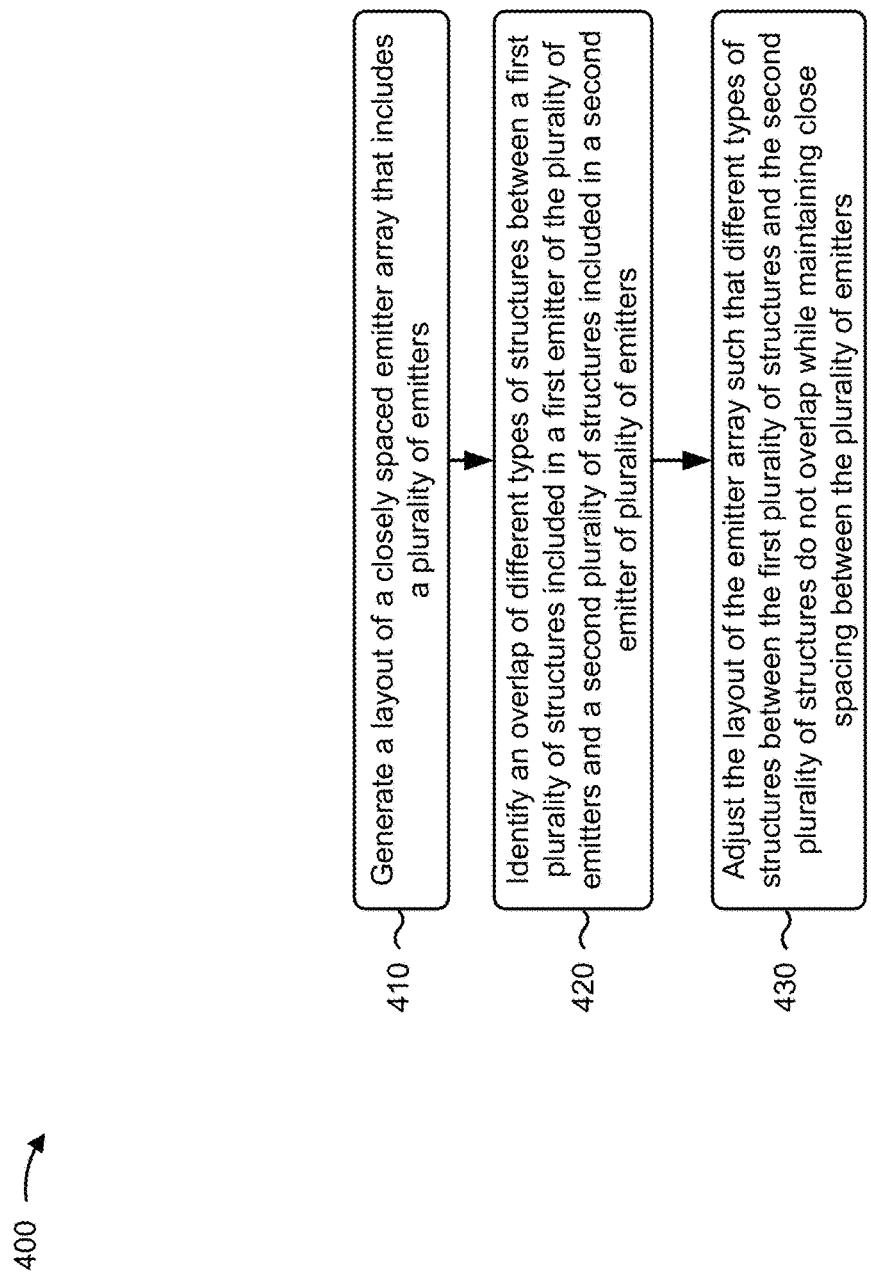

FIG. 4 is a flow chart of an example process 400 for optimizing a layout of a closely spaced emitter array. For example, FIG. 4 shows an example process 400 for optimizing a layout of an emitter array 200 described above. Notably, while example process 400 is described in the context of optimizing a layout of an emitter array 200, the implementations described with respect to process 400 apply equally to other types of closely spaced emitter arrays. In some implementations, process 400 may be performed by a device (e.g., device 300 and/or another device).

As shown in FIG. 4, process 400 may include generating a layout of a closely spaced emitter array that includes a plurality of emitters (block 410). For example, the device (e.g., using processor 320, memory 330, storage component 340, input component 350, output component 360, communication interface 370, and/or the like) may generate a layout of a closely spaced emitter array (e.g., emitter array 200) that includes a plurality of emitters (e.g., emitters 202). In some implementations, the layout of the closely spaced emitter array may include a two-dimensional pattern (e.g., a grid pattern, a hexagonal pattern, a random pattern, an irregular pattern, and/or the like) or configuration of the plurality of emitters on a substrate of a chip or device.

As further shown in FIG. 4, process 400 may include identifying an overlap of different types of structures between a first plurality of structures included in a first emitter of the plurality of emitters and a second plurality of structures included in a second emitter of the plurality of emitters (block 420). For example, the device (e.g., using processor 320, memory 330, storage component 340, input component 350, output component 360, communication interface 370, and/or the like) may identify an overlap of different types of structures between a first plurality of structures included in a first emitter of the plurality of emitters and a second plurality of structures included in a second emitter of the plurality of emitters. For example, the device may identify an overlap between a trench (e.g., trench 204) of the first emitter and a p-metal extension (e.g., p-metal extension 208) and/or a via (e.g., via 210) of the second emitter.

As further shown in FIG. 4, process 400 may include adjusting the layout of the closely spaced emitter array such that different types of structures between the first plurality of structures and the second plurality of structures do not overlap while maintaining close spacing between the plurality of emitters (block 430). For example, the device (e.g., using processor 320, memory 330, storage component 340, input component 350, output component 360, communication interface 370, and/or the like) may adjust the layout of the closely spaced emitter array such that different types of structures between the first plurality of structures and the second plurality of structures do not overlap while maintaining close spacing between the plurality of emitters.

In some implementations, adjusting the layout of the closely spaced emitter array may include one or more of adjusting a shape of one or more trenches (e.g., trenches 204) included in the first plurality of structures, adjusting a shape of one or more trenches included in the second plurality of structures, adjusting a size of one or more trenches included in the first plurality of structures, adjusting a size of one or more trenches included in the second plurality of structures, adjusting a shape of one or more vias (e.g., vias 210) included in the first plurality of structures, adjusting a shape of one or more vias included in the second plurality of structures, adjusting a size of one or more vias included in the first plurality of structures, adjusting a size of one or more vias included in the second plurality of structures, adjusting a spacing between a via and a trench included in the first plurality of structures, adjusting a spacing between a via and a trench included in the second plurality of structures, rotating at least one of the first emitter or the second emitter, or adjusting at least one of a quantity of vias included in the first plurality of structures or a quantity of vias included in the second plurality of structures, or adjusting at least one of a quantity of trenches included in the first plurality of structures or a quantity of trenches included in the second plurality of structures, adjusting the size, shape, spacing, and/or quantity of p-metal extensions (e.g., p-metal extensions 208) included in the first plurality of structures and/or the second plurality of structures, and/or the like.

In some implementations, adjusting the layout of the closely spaced emitter array may include adjusting the layout of the closely spaced emitter array based on one or more of the techniques, processes, and/or algorithms described in connection with process 500 of FIG. 5, process 600 of FIG. 6, and/or process 700 of FIG. 7.

Process 400 may include additional implementations, such as any single implementation or any combination of implementations described below and/or in connection with one or more other processes described elsewhere herein.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
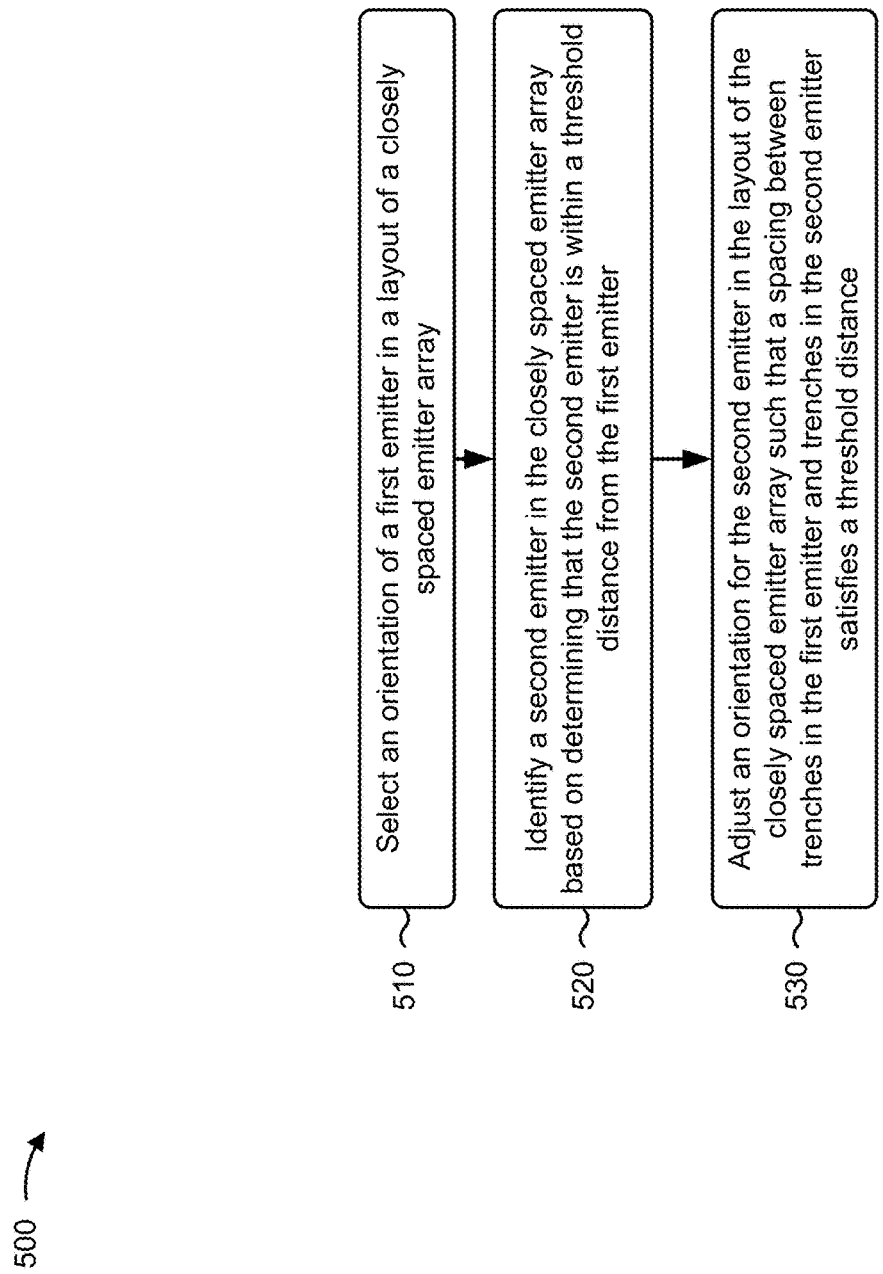

FIG. 5 is a flow chart of an example process 500 for optimizing a layout of a closely spaced emitter array. For example, FIG. 5 shows an example process 500 for optimizing a layout of an emitter array 200 described above. Notably, while example process 500 is described in the context of optimizing a layout of an emitter array 200, the implementations described with respect to process 500 apply equally to other types of closely spaced emitter arrays. In some implementations, process 500 may be performed by a device (e.g., device 300 and/or another device).

As shown in FIG. 5, process 500 may include selecting an orientation of a first emitter in a layout of a closely spaced emitter array (block 510). For example, the device (e.g., using processor 320, memory 330, storage component 340, input component 350, output component 360, communication interface 370, and/or the like) may select an orientation of a first emitter (e.g., first emitter 202) in a layout of a closely spaced emitter array (e.g., emitter array 200). In some implementations, process 500 may include identifying the first emitter based on determining that the first emitter has a minimum separation to a threshold quantity (e.g., three and/or the like) of adjacent emitters in the closely spaced emitter array. In some implementations, determining that the first emitter has a minimum separation to a threshold quantity of adjacent emitters in the closely spaced emitter array may include determining trench centers for each emitter in the closely spaced emitter array, and identifying the threshold quantity of adjacent emitters closest to the emitter from the trench center of the emitter.

In some implementations, the orientation of the first emitter may be determined based on a location of a notch (e.g., notch 212) in a p-metal ring (e.g., p-metal ring 206) included in the first emitter. In some implementations, selecting the orientation of the first emitter may include fixing the orientation of the first emitter at a particular rotation angle in the emitter array.

As further shown in FIG. 5, process 500 may include identifying a second emitter based on determining that the second emitter is within a threshold distance from the first emitter (block 520). For example, the device (e.g., using processor 320, memory 330, storage component 340, input component 350, output component 360, communication interface 370, and/or the like) may identify a second emitter (e.g., second emitter 202) based on determining that the second emitter is within a threshold distance from the first emitter. In some implementations, determining that the second emitter is within the threshold distance from the first emitter may include determining that the second emitter is the closest non-optimized emitter (e.g., not marked as optimized) to the first emitter having the minimum separation from the first emitter and/or to other optimized emitters.

As further shown in FIG. 5, process 500 may include adjusting an orientation for the second emitter in the layout of the emitter array such that a spacing between trenches in the first emitter and trenches in the second emitter satisfies a threshold distance (block 530). For example, the device (e.g., using processor 320, memory 330, storage component 340, input component 350, output component 360, communication interface 370, and/or the like) may adjust an orientation for the second emitter in the layout of the emitter array such that a spacing between trenches (e.g., trenches 204) in the first emitter and trenches (e.g., trenches 204) in the second emitter satisfies a threshold distance. In some implementations, adjusting the orientation for the second emitter may include rotating the second emitter such that the adjusted orientation of the second emitter minimizes trench-to-trench separation between the second emitter and the first emitter (and other optimized emitters in the emitter array).

In some implementations, process 500 may further include performing the techniques described above in connection with blocks 510-530 for other emitters in the emitter array until the layout of the emitter array is optimized.

Process 500 may include additional implementations, such as any single implementation or any combination of implementations described below and/or in connection with one or more other processes described elsewhere herein.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flow chart of an example process 600 for optimizing a layout of an emitter array. For example, FIG. 6 shows an example process 600 for optimizing a layout of an emitter array 200 described above. Notably, while example process 600 is described in the context of optimizing a layout of an emitter array 200, the implementations described with respect to process 600 apply equally to other types of emitter arrays. In some implementations, process 600 may be performed by a device (e.g., device 300 and/or another device).

As shown in FIG. 6, process 600 may include determining, for each of a plurality of candidate combinations of an orientation of a first emitter included in an emitter array and an orientation of a second emitter included in the emitter array, a first distance between a leading edge of a trench included in the first emitter and a trailing edge of a trench included in the second emitter, a second distance between a center of the trench included in the first emitter and a center of the trench included in the second emitter, and a third distance between a trailing edge of the trench included in the first emitter and a leading edge of the trench included in the second emitter (block 610). For example, the device (e.g., using processor 320, memory 330, storage component 340, input component 350, output component 360, communication interface 370, and/or the like) may determine, for each of a plurality of candidate combinations of an orientation of a first emitter (e.g., first emitter 202) included in an emitter array (e.g., emitter array 200) and an orientation of a second emitter (e.g., second emitter 202) included in the emitter array, a first distance between a leading edge (e.g., leading edge 218) of a trench (e.g., trench 204) included in the first emitter and a trailing edge (e.g., trailing edge 220) of a trench included in the second emitter, a second distance between a center of the trench included in the first emitter and a center of the trench included in the second emitter, and a third distance between a trailing edge of the trench included in the first emitter and a leading edge of the trench included in the second emitter.

In some implementations, the orientation of the first emitter may be determined based on a location of a notch (e.g., notch 212) in a p-metal ring (e.g., p-metal ring 206) included in the first emitter. In some implementations, the orientation of the second emitter may be determined based on a location of a notch (e.g., notch 212) in a p-metal ring (e.g., p-metal ring 206) included in the second emitter.

In some implementations, process 600 may include identifying the first emitter and the second emitter by grouping the first emitter and the second emitter into a group (e.g., group 214) based on design parameters for fabrication and/or mask layout of the emitter array. For example, the first emitter and the second emitter may be grouped based on proximity and/or a threshold distance between the first emitter and the second emitter. In some implementations, other emitters may be grouped with the first emitter and the second emitter, and groups of other emitters may be formed, based on similar parameters. In some implementations, emitters that are not grouped may be ignored.

In some implementations, process 600 may further include determining, for each of the plurality of candidate combinations of the orientation of the first emitter and the second emitter, a first distance between a leading edge of a p-metal extension (e.g., p-metal extension 208) included in the first emitter and a trailing edge of a p-metal extension included in the second emitter, a second distance between a center of the p-metal extension included in the first emitter and a center of the p-metal extension included in the second emitter, and a third distance between a trailing edge of the p-metal extension included in the first emitter and a leading edge of the p-metal extension included in the second emitter. In some implementations, process 600 may further include determining, for each of the plurality of candidate combinations of the orientation of the first emitter and the second emitter, a first distance between a leading edge of a via (e.g., via 210) included in the first emitter and a trailing edge of a via included in the second emitter, a second distance between a center of the via included in the first emitter and a center of the via included in the second emitter, and a third distance between a trailing edge of the via included in the first emitter and a leading edge of the via included in the second emitter.

As further shown in FIG. 6, process 600 may include selecting, for the layout of the emitter array and from the plurality of candidate combinations of an orientation of the first emitter and an orientation of the second emitter, a combination of an orientation of the first emitter and an orientation of the second emitter that minimizes the first distance, the second distance, and the third distance (block 620). For example, the device (e.g., using processor 320, memory 330, storage component 340, input component 350, output component 360, communication interface 370, and/or the like) may select, for the layout of the emitter array and from the plurality of candidate combinations of an orientation of the first emitter and an orientation of the second emitter, a combination of an orientation of the first emitter and an orientation of the second emitter that minimizes the first distance, the second distance, and the third distance.

Process 600 may include additional implementations, such as any single implementation or any combination of implementations described below and/or in connection with one or more other processes described elsewhere herein.

In some implementations, process 600 may further include selecting the first emitter as a seed in the group of emitters and determining the first distance, the second distance and the third distance for each of a plurality of candidate combinations of the orientation of a first emitter and the second emitter with the orientation of the first emitter fixed in the plurality of candidate combinations. In some implementations, the second emitter may be selected based on the second emitter being the closest un-optimized emitter to the first emitter. In some implementations, process 600 may further include marking the orientation of the second emitter as optimized based on selecting the combination of the orientation of the first emitter and the orientation of the second emitter that minimizes the first distance, the second distance, and the third distance.

In some implementations, process 600 may further include performing the techniques described above in connection with blocks 610-620 for other emitters in the group until the orientations of all emitters in the group are marked as optimized. In some implementations, process 600 may further include determining the sum of all the minimized first distances, second distances, and third distances for all of the emitter combinations in the group once all emitters in the group are marked as optimized.

In some implementations, process 600 may further include rotating, after determining the sum of all the minimized first distances, second distances, and third distances for all of the emitter combinations in the group, the first emitter (e.g., the seed) and marking the orientation of the first emitter as optimized, and repeating the techniques described above in connection with blocks 610-620 for all emitters in the emitter group until all emitters are marked as optimized based on the modified orientation of the first emitter. In some implementations, process 600 may further include determining the sum of all the minimized first distances, second distances, and third distances for all of the emitter combinations in the group once all emitters in the group are marked as optimized for the modified orientation of the first emitter. In some implementations, the orientation (or rotation angle) of the first emitter that results in the minimum or lowest first distances, second distances, and third distances combination may be the best-case orientation optimization for the group of emitters. In some implementations, process 600 may further include performing the techniques described above in connection with FIG. 6 for other groups of emitters in the emitter array.

In some implementations, other figures of merit may be used in addition to and/or alternately to distances between leading and trailing edges, such as radial width, shape, spacing, and/or other figures of merit.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a flow chart of an example process 700 for optimizing a layout of an emitter array. For example, FIG. 7 shows an example process 700 for optimizing a layout of an emitter array 200 described above. Notably, while example process 700 is described in the context of optimizing a layout of an emitter array 200, the implementations described with respect to process 700 apply equally to other types of emitter arrays. In some implementations, process 700 may be performed by a device (e.g., device 300 and/or another device).

As shown in FIG. 7, process 700 may include selecting a figure of merit associated with design parameters of an emitter array (block 710). For example, the device (e.g., using processor 320, memory 330, storage component 340, input component 350, output component 360, communication interface 370, and/or the like) may select a figure of merit associated with design parameters of an emitter array (e.g., emitter array 200). In some implementations, the design parameters may include minimizing and/or eliminating overlap between different structure types between adjacent emitters (e.g., emitters 202) in the emitter array.

In some implementations, the figure of merit may include an amount of area under overlap between the same type of structures in adjacent emitters of the emitter array, such as trenches (e.g., trenches 204) in adjacent emitters, p-metal extensions (e.g., p-metal extensions 208) in adjacent emitters, vias (e.g., vias 210) in adjacent emitters, and/or the like. In some implementations, the figure of merit may include a cost function associated with overlap between trenches of an emitter and p-metal extensions and/or vias of an adjacent emitter. In some implementations, process 700 may include selecting a plurality of figures of merit for the emitter array. In some implementations, other figure(s) of merit may be used for trenches, p-metal extensions, and/or vias of adjacent emitters.

As further shown in FIG. 7, process 700 may include parameterizing the figure of merit as a function of one or more parameters of emitters included in the emitter array (block 720). For example, the device (e.g., using processor 320, memory 330, storage component 340, input component 350, output component 360, communication interface 370, and/or the like) may parameterize the figure of merit as a function of one or more parameters of emitters included in the emitter array. For example, the figure of merit may be parameterized as a function of orientation (e.g., rotation angles) of emitters in the emitter array (e.g., figure of merit (FoM)=$f(\theta_1, \theta_2, \ldots \theta_n)$, where $\theta_i$ an orientation of an i-th emitter). As another example, the figure of merit may be parameterized as a function of the size, shape, configuration, quantity, spacing, and/or the like of structures (e.g., trenches, p-metal extensions, vias, and/or the like) in the emitters. In some implementations, the figure of merit may be parameterized as a function of a plurality of parameters of the emitters included in the emitter array.

As further shown in FIG. 7, process 700 may include solving an n-dimensional minimization function based on the parameterized figure of merit (block 730). For example, the device (e.g., using processor 320, memory 330, storage component 340, input component 350, output component 360, communication interface 370, and/or the like) may solve an n-dimensional minimization function based on the parameterized figure of merit. In some implementations, the n-dimensional minimization function may be an optimization function for the layout of the emitter array. The n dimensions may correspond to the quantity of emitters included in the emitter array. In some implementations, the n-dimensional minimization function may be the function of the parameterized figure of merit. In this case, solving the n-dimensional minimization function may include determining the one or more parameters of the emitters included in the emitter array that minimize the figure of merit (e.g., minimize overlap between different structure types in adjacent emitters, and/or the like).

Process 700 may include additional implementations, such as any single implementation or any combination of implementations described below and/or in connection with one or more other processes described elsewhere herein.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein the term "layer" is intended to be broadly construed as one or more layers and includes layers oriented horizontally, vertically, or at other angles.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An emitter array, comprising:
   a first emitter comprising a first plurality of radial extensions and a first plurality of trenches,
   wherein a first trench, of the first plurality of trenches, is arranged between a first pair of radial extensions, of the first plurality of radial extensions, and
   wherein the first plurality of radial extensions define a first total of radial extensions; and
   a second emitter, adjacent to the first emitter, comprising a second plurality of radial extensions and a second plurality of trenches,
   wherein a second trench, of the second plurality of trenches, is arranged between a second pair of radial extensions, of the second plurality of radial extensions, and
   wherein the second plurality of radial extensions defines a second total of radial extensions that is different than the first total of radial extensions.

2. The emitter array of claim 1, wherein each radial extension, of the first plurality of radial extensions and the second plurality of radial extensions, is a p-metal extension that includes a via.

3. The emitter array of claim 1, wherein the first plurality of radial extensions do not overlap with any of the second plurality of trenches; and
   wherein the second plurality of radial extensions do not overlap with any of the first plurality of trenches.

4. The emitter array of claim 1, wherein the first plurality of radial extensions do not overlap with any of the second plurality of radial extensions; and
   wherein the first plurality of trenches do not overlap with any of the second plurality of trenches.

5. The emitter array of claim 1, wherein a shape of the first trench is different than a shape of the second trench.

6. The emitter array of claim 1, wherein a size of the first trench is different than a size of the second trench.

7. The emitter array of claim 1, wherein a spacing between the first trench and the second trench is less than a spacing between any two other trenches, of the first plurality of trenches and the second plurality of trenches.

8. An emitter array, comprising:
   a first emitter comprising a first ring, a first plurality of extensions, and a first plurality of trenches,
   wherein a first trench, of the first plurality of trenches, is arranged between a first pair of extensions, of the first plurality of extensions, and
   wherein the first plurality of extensions define a first total of extensions that extend from the first ring; and
   a second emitter, adjacent to the first emitter, comprising a second ring, a second plurality of extensions and a second plurality of trenches,
   wherein a second trench, of the second plurality of trenches, is arranged between a second pair of extensions, of the second plurality of extensions, and
   wherein the second plurality of extensions defines a second total of extensions that extend from the second ring,
   wherein the second total of extensions is different than the first total of extensions.

9. The emitter array of claim 8, wherein each extension, of the first plurality of extensions and the second plurality of extensions, includes a via.

10. The emitter array of claim 8, wherein the first plurality of extensions do not overlap with any of the second plurality of trenches; and
    wherein the second plurality of extensions do not overlap with any of the first plurality of trenches.

11. The emitter array of claim 8, wherein the first trench does not overlap with the second trench.

12. The emitter array of claim 8, wherein a shape of the first trench is different than a shape of the second trench.

13. The emitter array of claim 8, wherein a size of the first trench is different than a size of the second trench.

14. The emitter array of claim 8, wherein a spacing between the first trench and the second trench is less than a spacing between any two other trenches, of the first plurality of trenches and the second plurality of trenches.

15. An emitter array, comprising:
    a first emitter comprising a first plurality of vias and a first plurality of trenches, wherein a first trench, of the first plurality of trenches, is arranged between a first pair of vias, of the first plurality of vias, and wherein the first plurality of vias define a first total of vias of the first emitter; and a second emitter, adjacent to the first emitter, comprising a second plurality of vias and a second plurality of trenches, wherein a second trench, of the second plurality of trenches, is arranged between a second pair of vias, of the second plurality of vias, and wherein the second plurality of vias defines a second total of vias of the second emitter that is different than the first total of vias of the first emitter.

16. The emitter array of claim 15, wherein each of the first plurality of vias are formed in a respective first radial extension of the first emitter, and wherein each of the second plurality of vias are formed in a respective second radial extension of the second emitter.

17. The emitter array of claim 15, wherein each of the first plurality of vias are formed through a first protective layer of the first emitter to expose a first p-ohmic layer under the first protective layer, and wherein each of the second plurality of vias are formed through a second protective layer of the second emitter to expose a second p-ohmic layer under the second protective layer.

18. The emitter array of claim 15, wherein the first plurality of trenches do not overlap with any of the second plurality of trenches.

19. The emitter array of claim 15, wherein a shape of one of the first plurality of trenches is different than a shape of one of the second plurality of trenches.

20. The emitter array of claim 15, wherein a spacing between one of the first plurality of trenches and one of the second plurality of trenches is less than a spacing between any two other trenches, of the first plurality of trenches and the second plurality of trenches.

* * * * *